United States Patent [19]

Matsui

[11] Patent Number: 4,603,974
[45] Date of Patent: Aug. 5, 1986

[54] RETICLE USED IN SEMICONDUCTOR DEVICE FABRICATION AND A METHOD FOR INSPECTING A RETICLE PATTERN THEREON

[75] Inventor: Shougo Matsui, Sagamihara, Japan

[73] Assignee: Fujitsu Limited, Kawasaki, Japan

[21] Appl. No.: 706,316

[22] Filed: Feb. 27, 1985

[30] Foreign Application Priority Data

Mar. 5, 1984 [JP] Japan .................................. 59-41584

[51] Int. Cl.$^4$ ............................................. G01B 11/00
[52] U.S. Cl. ...................................... 356/394; 355/53
[58] Field of Search ...................... 356/394; 355/53, 40

[56] References Cited

FOREIGN PATENT DOCUMENTS 1259537 1/1972 United Kingdom ................... 355/53

Primary Examiner—R. A. Rosenberger
Assistant Examiner—Crystal Cooper
Attorney, Agent, or Firm—Staas & Halsey

[57] ABSTRACT

A reticle used in a patterning process to fabricate a semiconductor device or a photomask, having a reference pattern consisting of reference pattern pieces, each having the same shape and size, the size being less than the resolution limit of a reduction exposure performed in the patterning process. The reference pattern pieces are extensively printed in an actual pattern region being for a semiconductor die on a reticle substrate with a reticle pattern, so that the reference pattern pieces are used for inspecting the reticle pattern but do not influence the printed pattern of the reticle pattern on a substrate of the semiconductor device or the photomask. In the inspection of the reticle pattern, the reference pattern pieces are used to provide the detected reticle pattern data obtained from the reticle pattern by scanning, so as to be able to be compared with designed reticle pattern data, i.e., synchronizing detected reference signals obtained from the reference pattern pieces by scanning with reference signals obtained from the designed data of the reference pattern.

10 Claims, 7 Drawing Figures

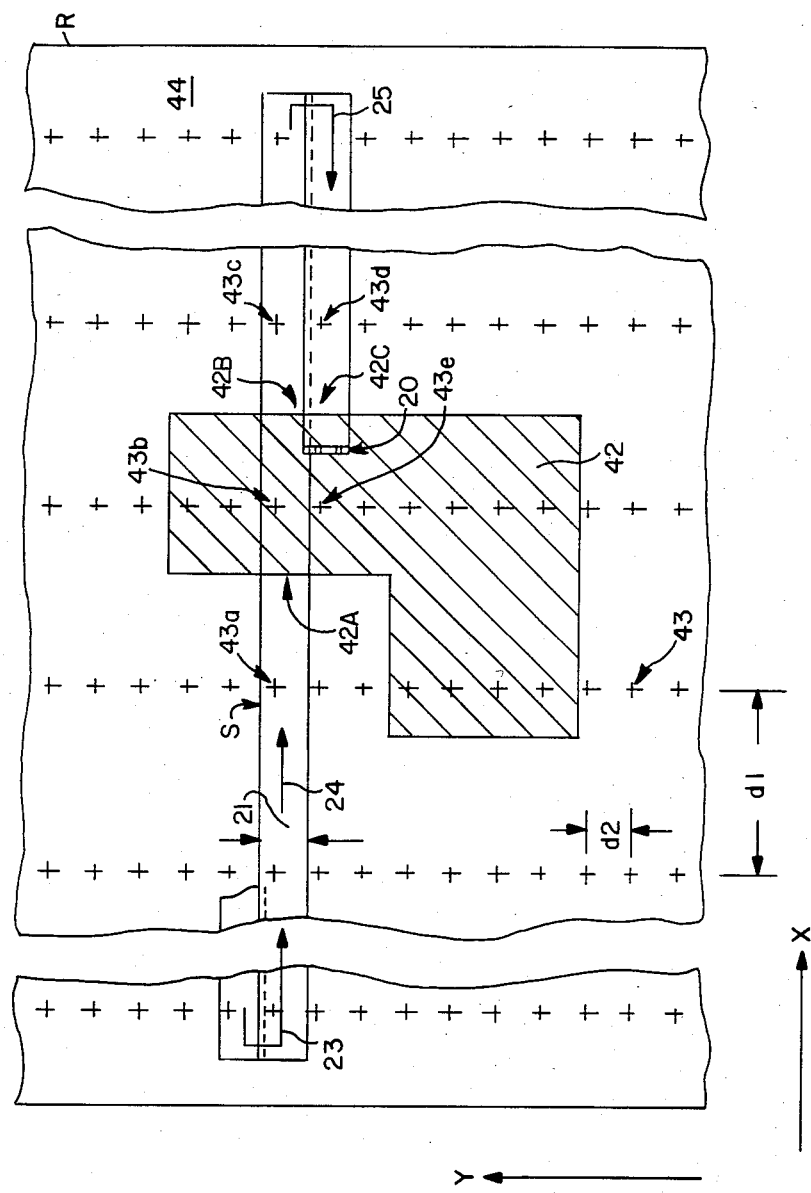

RETICLE USED IN SEMICONDUCTOR DEVICE FABRICATION AND A METHOD FOR INSPECTING A RETICLE PATTERN THEREON

BACKGROUND OF THE INVENTION

The present invention relates to a reticle used in a patterning process for fabricating a semiconductor device and a method for inspecting a reticle pattern thereon. More precisely, this invention relates to a reference pattern for inspecting the reticle pattern. The reference pattern consists of reference pattern pieces, each having the same shape and size, which are printed on a surface of the reticle and distributed extensively in an area of the reticle pattern. The size of each reference pattern piece is so small that there is no influence on the patterning process, because the image size of the piece projected on a substrate for the semiconductor device or a photomask is less than a resolution limit of reducing exposure in the patterning process.

The semiconductor device is fabricated by the following patterning process: a semiconductor die is fabricated by printing the images of different patterns on the same semiconductor substrate and its mass production is performed by printing simultaneously the same arranged patterns repeatedly. The reticle pattern is an original pattern in the patterning process.

A reticle substrate is made of a quartz glass plate on which the reticle pattern is formed by coating metal, such as nickel. The patterning on the semiconductor substrate is made by exposing directly the image of the reticle pattern or exposing the image of a photomask pattern which is fabricated by also printing the images of the reticle pattern on a photomask substrate made of a quartz glass plate.

Recently, integrated circuit (IC) design has led to very high packing density, so the reticle pattern has become very elaborate. Therefore, the exposure of the reticle pattern on the semiconductor or photomask substrate is perfomed by the following steps: enlarging the size of the reticle pattern as much as 5 to 10 times of the pattern size on the substrate; and exposing the image of the reticle pattern on the substrate by an optical system having a reduction power from 1/10 to 1/5.

Thus, the reticle pattern plays a significant part in the IC fabrication, so the inspection of the reticle pattern is very important. The inspection of the reticle pattern can be performed by the following three methods: first, a visual inspecting method is performed by human observation of each reticle pattern with a microscope; second, a pattern comparing method is performed by comparing electrical signals obtained by converting two optical images of the reticle patterns from a pair of microscopes using an image sensor; and third, a data comparing method is performed by comparing two groups of data; one group is obtained from a reticle pattern using an image sensor and the other is obtained from designing data for the fabrication of the reticle pattern.

The visual inspection method is rarely applied to the process in the mass production of the semiconductor device because many man-hours are required and an inspection error can easily occur.

The pattern comparing method is effective for inspecting a reticle pattern having repeated patterns such as memory patterns of a memory IC, because the speed of the inspection is high, but is not effective to inspect a reticle pattern not having repeated patterns, such as a pattern for a logic IC.

The data comparing method is effective for inspecting the reticle pattern not having the repeated patterns. Since the data comparing method provides high inspection accuracy, and since the inspection speed has recently increased because of the rapid development of the semiconductor device, the data comparing method has come to be applied to the inspection of almost all kinds of reticle patterns.

A reticle of the present invention can be applied to any of the above three methods, however the data comparing method will be discussed in this disclosure explaining briefly an operational principle of the prior art mask inspecting apparatus. The data comparing method can be performed by the mask inspecting apparatus whose block diagram is shown in FIG. 1. In the figure, a reticle pattern is coated on a reticle plate R which is installed on a stage (STAGE) 1; and a central processing unit (CPU) 14 controls a stage controller (STAGE CONT) 6 so as to drive the STAGE 1 to shift the reticle plate R in the X and Y directions against an optical system 2. Usually, one of the directions (direction X, for example) is for scanning and the other (direction Y) is for shifting the scanning to the next reticle pattern. The optical system 2 is for taking the image of the reticle pattern to an image sensor (IMAGE SENS) 3. The IMAGE SENS 3 consists of sensing elements formed in a linear array being arranged perpendicularly to an optical axis of the optical system 2 and in a transverse direction to a scanning direction of the reticle plate R. The array is arranged in the Y direction if the reticle plate R is moved in an X direction, for example. This is shown in FIG. 2 which is a plan view of the reticle plate R and illustrates the scanning of an instantaneous field of view (IFOV) of the IMAGE SENS 3. Reference numeral 20 shows the IFOV of the IMAGE SENS 3 which consists of 1024 linearly arrayed sensing elements. The IFOV 20 scans the surface of the reticle plate R in a direction 26 with a scanning width 21 when the plate R is moved in a minus X direction. The IFOV 20 scans all over the surface of the reticle plate R, moving the plate R toward minus and plus X directions alternately and plus Y direction step-by-step, for example. Reference numeral 22 is a reticle pattern, so, when the IFOV 220 is scanned across the pattern 22, the IMAGE SENS 3 in FIG. 1 produces electric output D1 consisting of 1024 analog signals, each having a high amplitude when the IFOV of a sensing element scans a part of the reticle pattern 22.

In FIG. 1, the signals D1 are fed to an analog digital converter (A/D CONV) 4 in which the signals D1 are converted to digital signals D9, each being like a bit signal 1 or 0 corresponding to the amplitude of the input analog signal. The digital signals D9 are fed to a first delay circuit (1st DELAY) 15 in which the digital signals D9 are delayed. This delay is performed by a command from the CPU 14 to adjust the timing between the signals D9 which intend to be written into a first memory (1st MEM) 5 and their address signals being provided in the CPU 14. This will be more precisely explained later. Delayed digital signals D3 from the 1st DELAY 15 are fed to the first memory (1st MEM) 5 and stored as detected pattern data.

On the other hand, the CPU 14 controls a magnetic tape device (MT) 7 so as to produce designed data signals of the reticle pattern synchronizing with the scanning of the IMAGE SENS 3 against the reticle plate R. Digital signals D2 from the MT 7 are fed into a data converter (DATA CONV) 8 in which the format of the signals D2 are converted to the same format as that of the signals D9; this is data format conversion. Converted signals D10 from the DATA CONV 8 are fed to a second delay circuit (2nd DELAY) 16 in which the signals D10 are delayed for the same reason mentioned above. Delayed digital signals D4 from the 2nd DELAY 16 are fed to a second memory (2nd MEM) 9 and stored as designed pattern data. The detected pattern data stored in the 1st MEM 5 and the designed pattern data stored in the 2nd MEM 9 are read out and fed to a first digital analog converter (1st D/A CONV) 10 and a second digital analog converter (2nd D/A CONV) 11, respectively, by a command from the CPU 14. Read out digital signals D5 and D6 from the 1st MEM 5 and the 2nd MEM 9, respectively, are converted into analog signals D7 and D8, respectively, and both analog signals are compared with each other by a comparator (COMP) 12, so that a fault signal is produced by an inspection output terminal 13, if there is a difference between them. The timing signal for the comparison is fed to the COMP 12 from the CPU 14.

In the above description, the process to provide the address signals in the CPU 14 for storing the delayed digital signals D3 and D4 into the 1st and 2nd memories 5 and 9, respectively, is significant to compare the detected pattern data with the designed pattern data, because the signals D3 and D4 must be stored into respective memory cells in respective 1st and 2nd memories 5 and 9 having their correct addresses so that the both data can be simply read out for the comparison as mentioned above.

As the reticle pattern is an inspecting object, it is impossible to obtain address information from the reticle pattern itself by only scanning. However, this has been solved by printing a reference pattern on the surface of the reticle plate with the reticle pattern, and designed data of the reference pattern are also stored in the magnetic tape and used as standard data. That is, the signals detected from an actual reference pattern can be synchronized with the signals obtained from the designed reference pattern data, so the address information of the inspecting reticle pattern can be provided from the detected reference pattern signals having been synchronized with the designed reference pattern signals.

A typical reference pattern of the prior art is shown in FIG 3. The figure is a plan view of a surface 31 of a reticle plate R. On the surface 31, reticle patterns 32A, 32B are formed in an actual pattern-region 34 surrounded by a chain line which corresponds to an area of a single semiconductor die, and a reference pattern 33 is formed out side of the actual pattern-region 34. That is, the reticle patterns 32A and 32B are surrounded by the reference pattern 33 having a shape of a frame consisting of four sides 33a, 33b, 33c, and 33d. The surface 31 is actually scanned by the IFOV of the linearly arrayed sensing elements as shown in FIG. 2, however, one element IFOV (d(IFOV)) will be discussed hereinafter for simplicity.

When the d(IFOV) scans along a scanning line S1 as shown in FIG. 3, a detected signal of the reference pattern 33c is obtained at the point P1. The detected signal will be simply called a "detected reference signal". From the detected reference signal, the address signals along the scanning line S1 can be obtained as follows: in FIGS. 1 and 2, the detected reference signal is fed to the 1st DELAY 15 and to the CPU 14 through the A/D CONV 4; at the same time, the MT 7 produces a "signal" of the designed reference pattern data corresponding to the point P1 under the control of the CPU 14, (the signal will be called a "designed reference signal"); the designed reference signal is fed to the 2nd DELAY 16 and to the CPU 14 through the DATA CONV 8; in the CPU 14, the detected reference signal is synchronized with the designed reference signal producing a synchronized detected reference signal; the address signals along the scanning line S1 from the point P1 are obtained from the synchronized detected reference signal using a clock signal provided in the CPU 14 and stored in a memory device in the CPU 14; the stored address signals are read out from the memory device and fed to the 1st MEM 5; and the delayed digital signals D3 obtained along the scanning line S1 are written into the 1st MEM 5 by the address signals under a command from the CPU 14.

Address signals along another scanning line can be obtained in the same way, with the address signals being stored in the same memory device in the CPU 14, and the delayed digital signal D3 obtained along the scanning line being stored into the 1st MEM 5 by the address signals under a command from the CPU 14.

Address signals of the designed data along a scanning line corresponding to the scanning line S1 can be also provided and are stored in another memory device in the CPU 14, however, the synchronization is not necessary because the designed reference signal itself is a standard. The address signals are fed to 2nd MEM 9 and the delayed digital signals D4 are stored into the 2nd MEM 9 by the address signals under a command from the CPU 14. The 1st DELAY 15 and 2nd DELAY 16 function so as to delay the digital signals D9 and D10 for adjusting a timing to provide their address signals in the CPU 14 for storing them into the 1st MEM 5 and 2nd MEM 9, respectively.

Any kind of shape can be used as a reference pattern in principle. The prior art reference pattern 33 in FIG. 3 is popular because the synchronization by the reference pattern can be performed in every scanning in the X direction. However, as the packing density of the reticle pattern has recently increased the reference pattern 33 incurs problems as follows:

(1) the quantity of the memory devices for the address signals in the CPU 14 has increased tremendously;

(2) the inspection accuracy is difficult to keep high because the interval between the reference patterns substantially becomes long against the reticle patterns having high packing density;

(3) false rejection of the inspection due to the irregular scanning motion of the stage occurs. False rejection is a miss judgement of the inspection and occurs when the stage moves irregularly during the interval of the reference patterns, for example, when comparing the scanning lines S1 and S2 in FIG. 3, the occurring probability of the irregular motion in the interval between P1 and P11 on the scanning line S1 is less than that in the interval between P2 and P21 on the scanning line S2 because the former interval is shorter than the latter interval; and (4) the orthogonality of the reticle pattern is difficult to inspect by the reference pattern 33 because the reference patterns 33d and 33b in the Y direction are too far apart.

These problems can be solved if the reference patterns are distributed in the area of the reticle pattern.

However, it has been considered that this is impossible to realize, because, since the reference pattern is designated as a constant pattern, the freedom of designing the reticle pattern will be reduced and much space for the reticle pattern will be lost.

SUMMARY OF THE INVENTION

An object of the present invention is to save the quantity of the memory devices used in the CPU of the inspecting apparatus applying the data comparing method.

Another object is to maintain the high accuracy in the inspection of the reticle pattern at a low cost.

Another object is to avoid the occurrence of false rejection due to irregular scanning motion of the stage in the reticle pattern inspection.

Still another object is to perform the inspection of the orthogonality of the reticle pattern.

The present invention can be performed by dividing the reference pattern into a plurality of pieces and shortening the interval of the pieces and distributing the pieces extensively in the area of the reticle pattern. The size of each piece printed on the reticle plate is small, but is of sufficient size to be detected in the scanning. However the image of the piece on the semiconductor device or the photomask is so small that the image is not printed, because its size is under the resolution limit of a reducing optical system used in a patterning process for the fabrication of the semiconductor device or the photomask.

BRIEF DESCRIPTION OF THE DRAWINGS

FIG. 6 is a plan view of a part of the reticle plate surface on which the reference pattern of the present invention is printed with the reticle pattern, illustrating particularly scanning over the reticle plate.

DETAILED DESCRIPTION OF THE PREFERRED EMBODIMENTS

The present invention is based on the following two points in the patterning or printing process of the reticle pattern on the semiconductor device or the photomask: first, there is a difference of size from as much as 5 to 10 times between the reticle pattern and its printed pattern on the seniconductor device or the photomask; and second, the optical system for printing the image of the reticle pattern onto the semiconductor device of the photomask has the characteristic of "resolution" by which the printable size is limited.

From these above points, the reference pattern can be divided into a plurality of small pieces, each having the same size and shape. The size can be determined so as to be enough to be detected in the reticle pattern inspection, but not enough to be printed on the semiconductor device or photomask by a reduction exposure in the reticle patterning process. Therefore, the pieces of the reference pattern in the present invention, which will be simply called "reference patterns" hereinafter, can be distributed any place on the reticle plate, even in the reticle pattern, so that the reference patterns can be arranged more closely. The reference pattern can be marked on the reticle plate so as to be an opaque, pattern-like, reticle pattern in the space of no reticle pattern and a transparent pattern in the reticle pattern.

Figure 1:
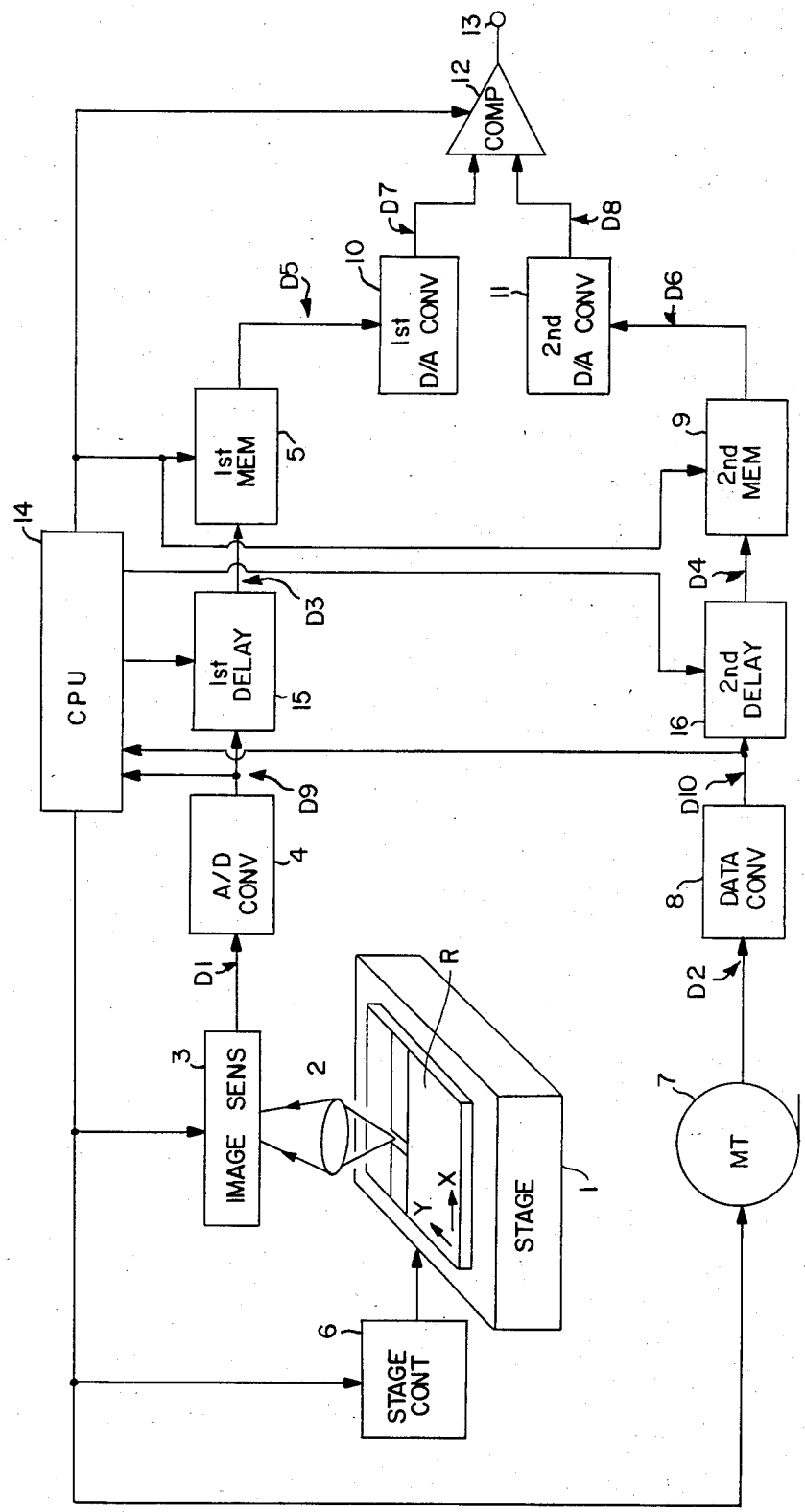
FIG. 1 is a diagram diagrammatic view of an apparatus for inspecting the reticle pattern.
Figure 2:
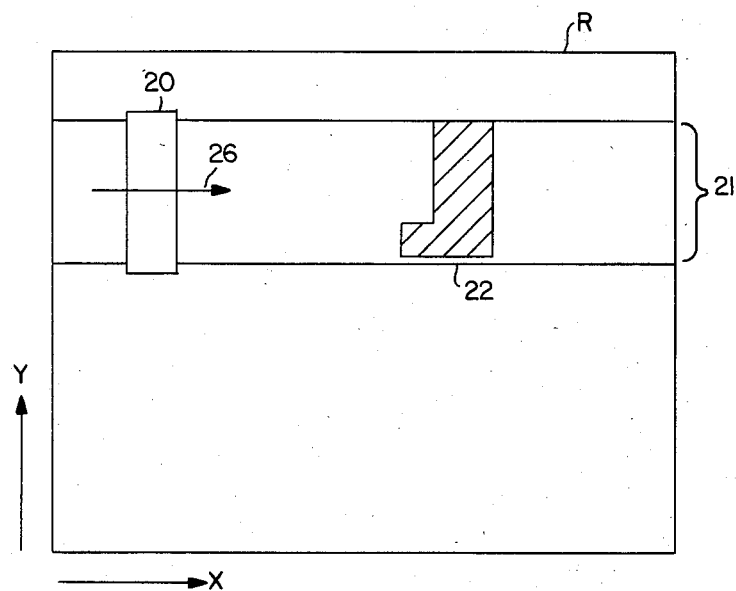
FIG. 2 is a plan view illustrating a linear arrayed image sensor of the inspecting apparatus scanning over the surface of a reticle plate.
Figure 3:
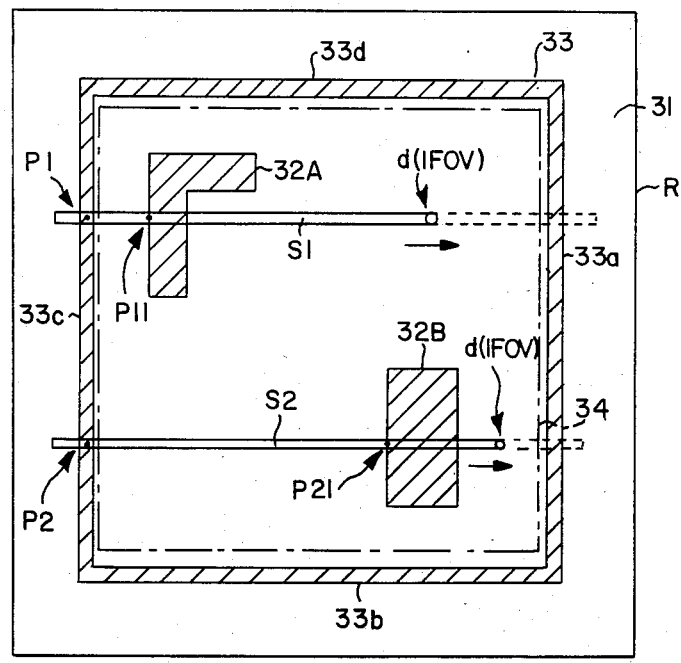
FIG. 3 is a plan view of the surface of a reticle plate on which a reference pattern of the prior art is printed with the reticle pattern.
Figure 4:
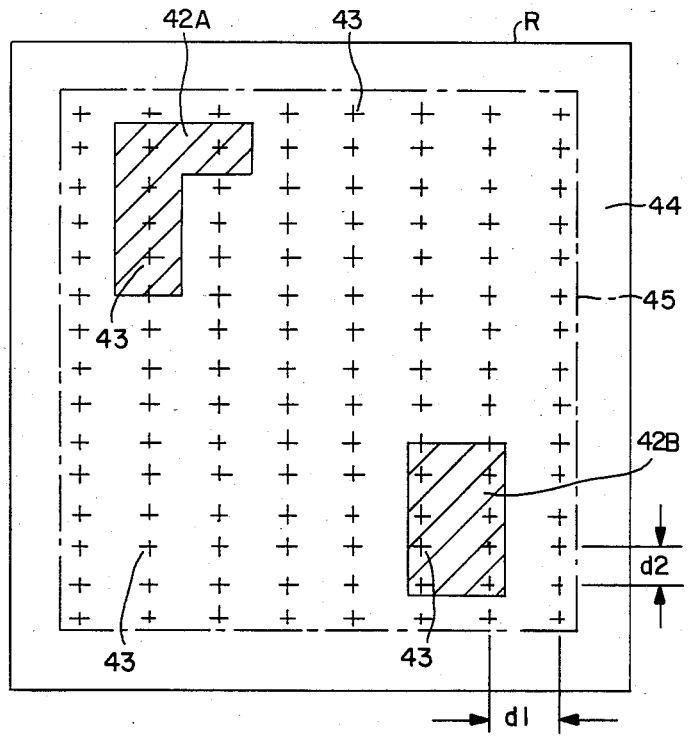
FIG. 4 is a plan view of the surface of a reticle plate on which an embodiment of the reference pattern of the present invention is printed with the reticle pattern.

FIG. 4 shows a preferred embodiment of the reference patterns of the present invention. In the figure, a plurality of small pieces (cross-shaped marks) are the reference patterns 43 which are extensively distributed in the actual pattern-region 45. The pattern region 45 is defined by a chain line, on the surface 44 of the reticle plate R. The reference patterns 43 are arranged regularly having spacing or pitches d1 and d2 in the lateral and longitudinal directions, respectively. Reference numerals 42A and 42B are reticle patterns in which the reference patterns 43 are also printed.

Figure 5A:
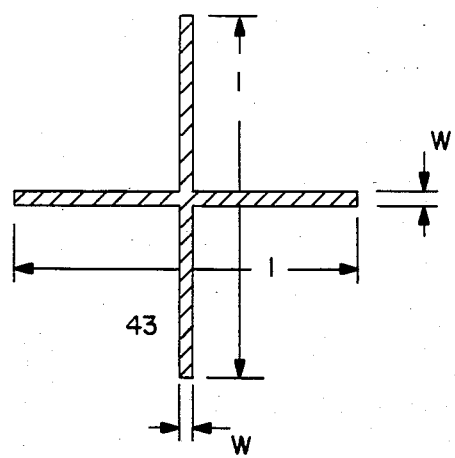
FIG. 5A is a diagrammatic view illustrating an embodiment of the shape of the reference pattern piece of the present invention.
Figure 5B:
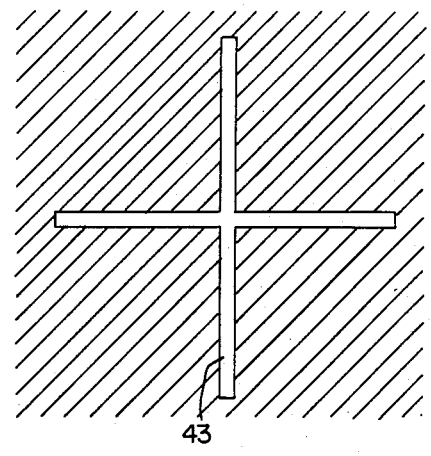
FIG. 5B is a diagrammatic view illustrating the embodiment of the shape of the reference pattern piece shown in FIG. 5A.

Each piece reference pattern 43 is of equal shape and size. The size is small so that the above conditions are satisfied. The reference pattern can take any shape in principle, FIGS. 5A and 5B show a cross-shaped pattern as one embodiment of the present invention. FIGS. 5A and 5B show an opaque and a transparent pattern, respectively; in the figures, the cross hatched portions are optically opaque. The width (w) of each cross arm should be less than 1 micron, if the reduction power of the reducing optical system for projecting the reticle pattern on the semiconductor or photomask substrate is 1/5, and less than 2 microns for a reduction power of 1/10. The length (1) of each cross arm can take any length, but is 100 microns in FIG. 5, for example.

FIG. 6 illustrates how the surface 44 of the reticle plate R is scanned, showing a plan view of the part of the surface 44 of the reticle plate R on which reference patterns 43 and a reticle pattern 42 are printed. Reference symbol S shows a scanning line provided by running the IFOV 20 in the X direction writing a zigzag pattern from end to end of the surface 44, as shown by arrows 23, 24, and 25, the IFOV 20 consisting of 1024 d(IFOV) for example. The reference patterns 43 are regulary distributed on the surface 44 having the lateral and longitudinal pitches d1 and d2, respectively.

There is a relation between the longitudinal pitch d2 and a width 21 of the scanning line S, such that the width 21 is a little larger than the pitch d2 (for example the width 21 is 1.1 mm and the pitch d2 is 1 mm), so that at least a d(IFOV) of the IFOV 20 scans a reference pattern 43.

When the d(IFOV) scans over a reference pattern 43a, the detected reference signal of the reference pattern 43a is synchronized in the CPU 14 with the designated reference signal of the designed reference pattern corresponding to the reference pattern 43a. In addition, the synchronized detected reference signal of the pattern 43a designates the address signals for other detected signals in the area restricted by the width 21 and two lines which transverse with the scanning line S involving, respectively, the reference patterns 43a and 43b. In the same way, all other address signals in the area of the scanning line S restricted by transversal lines involving reference patterns 43b and 43c and transversal lines involving reference patterns 43d and 43e are determined by a synchronized detected reference signal of the reference pattern 43b and 43d, respectively, in the CPU 14. Therefore, addresses for all the signals detected from the reticle pattern 42 are designated, so that the detected signals are stored correctly in the 1st MEM 5 and the reticle pattern 42 can be inspected by the comparison with the designed reticle pattern data corresponding to the reticle pattern 42.

Comparing the reference patterns of the present invention and the prior art, it is clear that:

the number of the memory elements in the CPU 14 for providing the address signals of the detected signals in the present invention is less than that in the prior art, because the X direction interval of the reference patterns in the present invention is less than that in the prior art;

the inspection accuracy against a reticle pattern having high packing density in the present invention is higher than that in the prior art, because the resolution for detecting the reticle pattern in the present invention can be increased more than that in the prior art in the limitation of the memory element numbers;

the number of the false rejections of the inspecton due to the irregular motion of the stage in the present invention is less than that in the prior art, because the X direction interval of the reference patterns in the present invention is less than that in the prior art; and the inspection of the orthogonality of the reticle pattern can be easily performed by the present invention, because the Y direction interval of the reticle patterns in the present invention is less than that in the prior art.

Since the size of each reference pattern 43 is small, as shown in FIG. 5, the reference pattern does not appear on the reticle pattern printed on the semiconductor or the photomask substrate. For example, in FIG. 5, with width w of the reference pattern of 1 micron, the size of the exposed image of the width w becomes theoretically 0.2 micron, if the reduction power of the optical system is 1/5. However, this 0.2 micron size is less than the resolution power of the reducing optical system, i.e., the resolution power is approximately 1 micron. This means that the width w of 1 micron actually does not influence the pattern printed on the substrate. The width w can take 2 microns if the reduction power is 1/10.

What is claimed is:

1. A reticle applied to a patterning process for fabricating a semiconductor device comprising:
    a reticle substrate;
    a reticle pattern formed in an actual pattern-region on a surface of said reticle substrate; and
    a reference pattern formed in said actual pattern-region on said surface with said reticle pattern, the reference pattern having a size less than a resolution limit of a reduction exposure performed in said patterning process.

2. A reticle according to claim 1, wherein said reticle substrate is optically transparent, said reticle pattern is optically opaque, said reference pattern is an optically opaque pattern on said reticle substrate on which no reticle pattern exists, and said reference pattern is an optically transparent pattern on said reticle pattern.

3. A reticle according to claim 2, wherein said reference pattern comprises a plurality of reference pattern pieces, each having the same shape and size, the size being less than a resolution limit of a reduction exposure performed in said patterning process, and wherein said plurality of reference pattern pieces is arranged on said surface with an equal first pitch in a lateral direction and with an equal second pitch in the longitudinal direction.

4. A method for inspecting a reticle pattern which is formed on a reticle substrate and applied to a patterning process for fabricating a semiconductor device, said method comprising the steps of:
    forming said reticle pattern and a reference pattern in an actual pattern-region on a surface of said reticle substrate, said reference pattern having a size less than a resolution limit of a reduction exposure performed in said patterning process;
    detecting said reticle pattern and said reference pattern, respectively, by scanning optically an instantaneous field of view of an image sensing device and producing detected reticle pattern signals and detected reference pattern signals, respectively;
    synchronizing individually said detected reference pattern signals with designed reference pattern signals obtained from designed reference pattern data; and
    comparing said detected reticle pattern data with designed reticle pattern data.

5. A method according to claim 4,
    wherein said forming step further includes the step of forming the reticle pattern with a plurality of reticle pattern pieces, each having the same shape and size, the size being less than a resolution limit of a reduction exposure performed in said patterning process, and with said plurality of reference pattern pieces arranged on said surface, each separated by an equal first pitch in a lateral direction and an equal second pitch in a longitudinal direction.

6. A method according to claim 5, wherein said image sensing device comprises a plurality of linearly arrayed sensing elements whose array direction is perpendicular to a direction of said scanning, and said second pitch is less than a length of an instantaneous field view of said linearly arrayed sensing elements.

7. A method according to claim 4, 5, or 6, wherein said reticle substrate is optically transparent, said reticle pattern is optically opaque, said reference pattern is an optically opaque pattern on said reticle substrate on which no reticle pattern exists, and said reference pattern is an optically transparent pattern on said reticle pattern.

8. A method for fabricating a semiconductor device applying a patterning process, said method comprising the steps of:
    forming a reticle substrate;
    forming a reticle pattern in an actual pattern-region on a surface of said reticle substrate;
    forming a reference pattern in said actual pattern-region on said surface with said reticle pattern, the reference pattern having a size less than a resolution limit of a reduction exposure performed in said patterning process;
    inspecting said reticle pattern formed on said surface by detecting detected reference signals from said reference pattern and synchronizing said detected reference signals with designed reference signals obtained from designed reference pattern data; and
    printing an image of said reticle pattern onto an exposed substrate for said semiconductor device by means of optical reduction exposure in said patterning process.

9. A method according to claim 8, wherein said exposed substrate comprises a semiconductor substrate.

10. A method according to claim 8, wherein said exposed substrate comprises a photomask substrate.

* * * * *